United States Patent
Subat et al.

(10) Patent No.: US 9,191,737 B2
(45) Date of Patent: Nov. 17, 2015

(54) CREST-FACTOR BASED GAIN MODIFICATION

(71) Applicant: Bose Corporation, Framingham, MA (US)

(72) Inventors: Bradford Kyle Subat, Northborough, MA (US); Dilip Gopinath Warrier, Acton, MA (US); Paul Joyce, Milford, NH (US)

(73) Assignee: Bose Corporation, Framingham, MA (US)

( * ) Notice: Subject to any disclaimer, the term of this patent is extended or adjusted under 35 U.S.C. 154(b) by 273 days.

(21) Appl. No.: 13/961,399

(22) Filed: Aug. 7, 2013

(65) Prior Publication Data

US 2015/0043739 A1     Feb. 12, 2015

(51) Int. Cl.
*H04R 3/00*          (2006.01)
*H03G 3/30*          (2006.01)
*H03G 7/00*          (2006.01)

(52) U.S. Cl.
CPC ............... *H04R 3/00* (2013.01); *H03G 3/3005* (2013.01); *H03G 7/002* (2013.01); *H03G 7/007* (2013.01)

(58) Field of Classification Search
CPC ................................ H04R 3/00; H03G 3/2005
USPC .......................................................... 381/59
See application file for complete search history.

(56) References Cited

U.S. PATENT DOCUMENTS

| | | |
|---|---|---|
| 4,939,786 A | 7/1990 | McCallum et al. |
| 6,448,857 B1 | 9/2002 | Quintanar et al. |
| 6,611,169 B2 | 8/2003 | Mendenhall |
| 7,061,740 B2 | 6/2006 | Mendenhall |
| 7,885,402 B2 | 2/2011 | Ellison |
| 2008/0056504 A1 | 3/2008 | Gorges et al. |
| 2010/0254546 A1 | 10/2010 | Hosomi |
| 2011/0009987 A1 | 1/2011 | Seefeldt et al. |
| 2013/0022208 A1 | 1/2013 | Dhuyvetter |
| 2013/0077796 A1 | 3/2013 | Risbo et al. |

FOREIGN PATENT DOCUMENTS

WO       98/47224       10/1998

OTHER PUBLICATIONS

International Search Report & Written Opinion in counterpart international patent application No. PCT/US14/47427, mailed on Oct. 7, 2014; 13 pages.

*Primary Examiner* — Sonia Gay
(74) *Attorney, Agent, or Firm* — Schmeiser, Olsen & Watts LLP (57) ABSTRACT

A method for crest-factor based gain modification comprises sampling audio inputs to determine an energy for each input. The inputs are amplified to produce output channels. An average energy is determined for each frame by adding a percentage of a last average energy to a residual percentage of the energy. The last average energy is equal to zero for a first sampling of the audio inputs. The residual percentage is equal to one hundred minus the percentage of the last average energy. The amplifier gain is iteratively reduced by a decrease-step for a fixed period until a number of exceeding-inputs is less than or equal to a maximum. The exceeding-inputs have an average energy that exceeds a maximum-energy. The amplifier gain is iteratively increased by an increase-step for another fixed period until a number of exceeding-inputs is greater than a maximum.

17 Claims, 8 Drawing Sheets

CREST-FACTOR BASED GAIN MODIFICATION

FIELD OF THE INVENTION

The invention relates generally to audio systems. More specifically, the invention relates to adaptively limiting amplifier outputs to prevent excessive thermal dissipation.

BACKGROUND

Audio systems typically require heat-sinks to dissipate heat energy generated by the amplification of audio channels. Multiple channels and high power levels are common in modern audio systems thus contributing to addition to the heat energy. Audio amplifiers contain current sensitive components whose temperature rises rapidly with excessive current consumption (e.g. bipolar devices can experience thermal runaway) and can cause irreparable damage to the audio system. Furthermore, peak power consumption occurs during transient events (e.g. playing audio at an unusually loud volume) but can require a heat sink that is both larger and heavier than required for typical operation of the audio system. A need exists to efficiently manage thermal energy consumption during these transient events without requiring an excessively large and heavy heat-sink and general system overdesign.

U.S. Pat. No. 4,939,786 discloses an adaptive thermal protection method and arrangement for a power amplifier by remote sense, which maximizes the amount of power from electronic equipment such as a radio frequency (RF) power amplifier, having a finite heat sink and operating intermittently over a period of time. This method and apparatus utilizes a remote temperature sensor and knowledge of the on/off, or key/dekey times in conjunction with a stored, predetermined thermal model to adjust the operating power level to a maximum permissible point within a range of operating power levels such that the projected temperature of the power amplifier does not exceed a preset limit. In so doing, the apparatus and method combines the advantages of thermal protection and power maximization and effects gradual changes in the operating power level by adapting to variable environmental and operational conditions. This system relies on knowledge of on/off keying durations and does not teach a solution to adaptive thermal management of continuous time audio systems. Thus, there remains a need for the efficient thermal management of audio systems.

BRIEF SUMMARY

All examples and features mentioned below can be combined in any technically possible way. In one aspect, a method for crest-factor based gain modification includes sampling at least one audio input to create a frame for each of the at least one audio inputs. Each audio input is amplified by a respective amplifier to produce an output channel and each frame has at least one sample of the respective at least one audio input. An energy is determined for each frame of the respective audio inputs. An average energy is determined for each frame by adding a percentage of a last average energy to a residual percentage of the energy. The last average energy is equal to zero for a first sampling of the at least one audio input and the residual percentage is equal to one hundred minus the percentage of the last average energy. A gain of the respective amplifier for at least one audio input is iteratively reduced by a decrease-step for a duration being equal to a decrease period until a number of exceeding-audio-inputs is less than or equal to a maximum-number. The exceeding-audio-inputs have an average energy that exceeds a maximum-energy-level. The gain of the respective amplifier for at least one audio input is iteratively increased by an increase-step for the duration being equal to an increase-period until a number of exceeding-audio-inputs is greater than a maximum-number.

Embodiments may include one of the following features, or any combination thereof. Iteratively reducing the gain of the respective amplifier is terminated if the gain reaches a minimum-gain. Iteratively increasing the gain of the respective amplifier is terminated if the gain reaches a maximum-gain. The maximum-energy-level is determined by a value of an ambient temperature. The maximum-energy-level is determined by a temperature of a component in each amplifier. The maximum-energy-level is determined by a load impedance of at least one speaker in electrical communication with a respective output channel. The maximum-energy-level is determined by a battery voltage of a battery used to power each amplifier. The gain of the respective amplifier is ramped in response to one of an iterative increase in the gain and an iterative decrease in the gain. At least one audio input includes all of the audio inputs. The frame includes thirty two samples for each of the at least one audio input. Determining the average energy for each frame includes calculating the average of a squared value for each sample in the respective frame. Sampling at least one audio input includes sampling an input current of the respective audio input. Sampling at least one audio input includes sampling an input voltage of the respective audio input.

In another aspect, a method for crest-factor based gain modification includes determining an energy for at least one audio input. Each audio input is amplified by a respective amplifier to produce an output channel. An average energy for at least one audio input is determined by adding a percentage of a last average energy to a residual percentage of the energy. The last average energy is equal to zero for a first sampling of the at least one audio input and the residual percentage is equal to one hundred minus the percentage of the last average energy. A gain of the respective amplifier for at least one audio input is iteratively reduced by a decrease-step for a duration being equal to a decrease-period while the gain is greater than a minimum-gain and until a number of exceeding-audio-inputs is less than or equal to a maximum-number. The exceeding-audio-inputs have an average energy that exceeds a maximum-energy-level. The gain of the respective amplifier for at least one audio input is iteratively increased by an increase-step for the duration being equal to an increase-period while the gain is less than a maximum-gain and until a number of exceeding-audio-inputs is greater than a maximum-number.

Embodiments may include one of the above and/or below features, or any combination thereof. The maximum-energy-level is determined by a load impedance of at least one speaker in electrical communication with a respective output channel. The maximum-energy-level is determined by a value of an ambient temperature. The maximum-energy-level is determined by a temperature of a component in each amplifier. The gain of the respective amplifier is ramped in response to one of an iterative increase in the gain and an iterative decrease in the gain. At least one audio input includes all of the audio inputs.

In another aspect, a computer program product for crest-factor based gain modification includes a non-transitory computer readable storage medium having computer readable program code embodied therewith. The computer readable program code comprises computer readable program code configured to determine an energy for at least one audio input.

Each audio input is amplified by a respective amplifier to produce an output channel. Computer readable program code is configured to determine an average energy for at least one audio input by adding a percentage of a last average energy to a residual percentage of the energy. The last average energy is equal to zero for a first sampling of the at least one audio input. The residual percentage is equal to one hundred minus the percentage of the last average energy. Computer readable program code is configured to iteratively reduce a gain of the respective amplifier for at least one audio input by a decrease-step for a duration being equal to a decrease-period while the gain is greater than a minimum-gain and until a number of exceeding-audio-inputs is less than or equal to a maximum-number. The exceeding-audio-inputs have an average energy that exceeds a maximum-energy-level. Computer readable program code is configured to iteratively increase the gain of the respective amplifier for at least one audio input by an increase-step for the duration being equal to an increase-period while the gain is less than a maximum-gain and until a number of exceeding-audio-inputs is greater than a maximum-number.

BRIEF DESCRIPTION OF THE SEVERAL VIEWS OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Embodiments of methods and systems described herein provide for the efficient thermal management of audio systems by adaptively controlling energy dissipation. Audio systems must be designed to handle worst-case conditions that may occur infrequently. These worst-case conditions impose limitations on the audio system. For example, a heat sink used to dissipate heat from the system will typically be larger and consequently heavier to handle worst-case conditions. Some examples of worst-case conditions include use of low impedance speakers that draw more current, high ambient temperatures and extreme output volumes.

Figure 1:
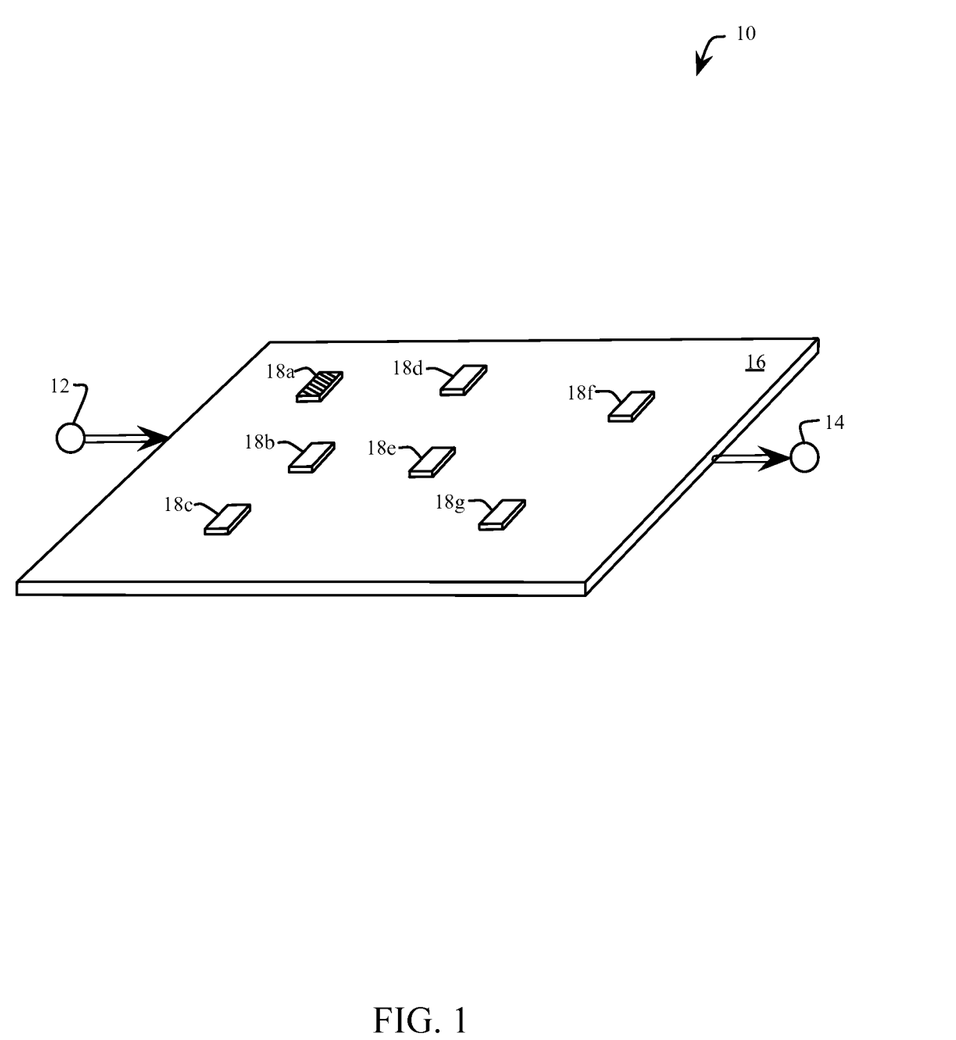
FIG. 1 is a perspective view of an amplifier circuit board.

In one embodiment, worst-case thermal operating conditions are limited by specific components on an amplifier circuit board 10 shown in FIG. 1. The amplifier 10 includes an audio input 12 and an audio output 14, each associated with a channel. The amplifier circuit board 16 amplifies the input 12 with a plurality of components 18a through 18g (generally 18). The components include integrated circuits and passive components (e.g. resistors and capacitors). The amplifier is limited by component 18a. In one example, component 18a is a bipolar device, with the potential for thermal runaway at elevated temperatures. The amplifier 10 is shown for an audio system. The concepts disclosed herein are envisioned to apply to other systems, including video systems for example.

Figure 2:
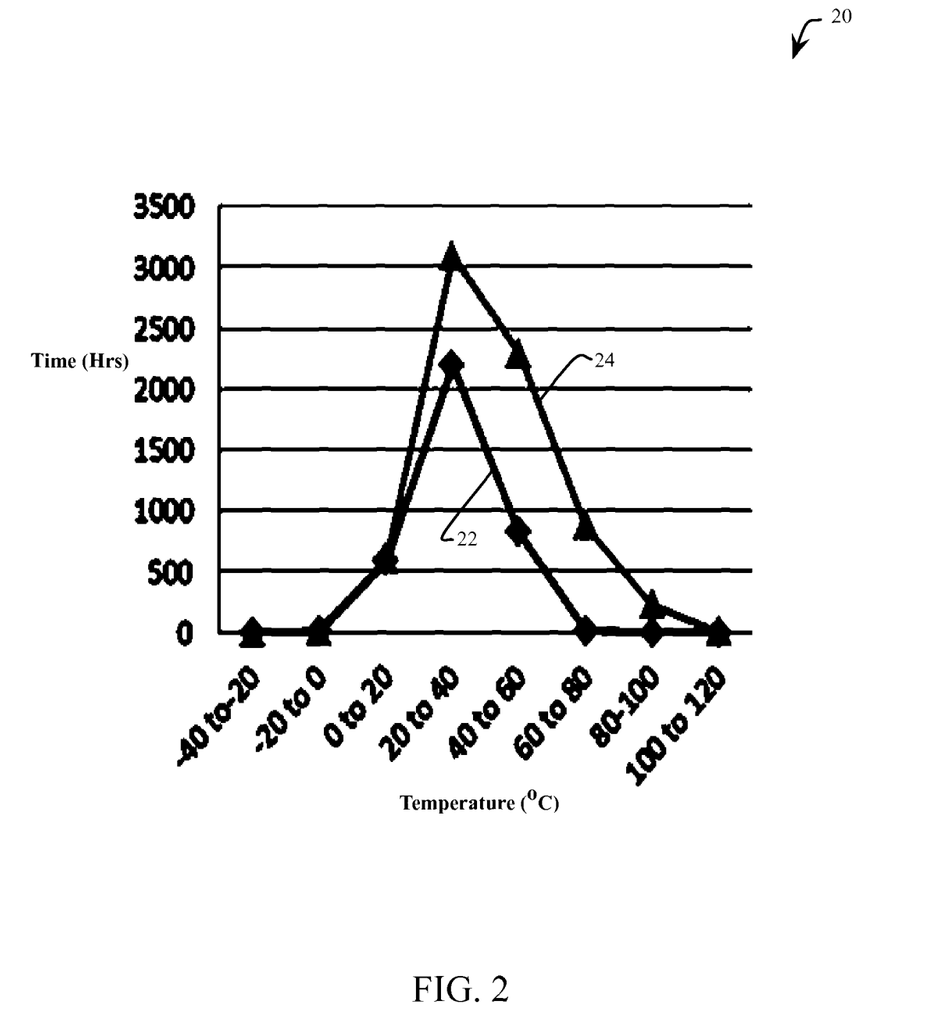
FIG. 2 is graphical view showing typical operating temperatures for an embodiment of an audio amplifier system.
Figure 3:
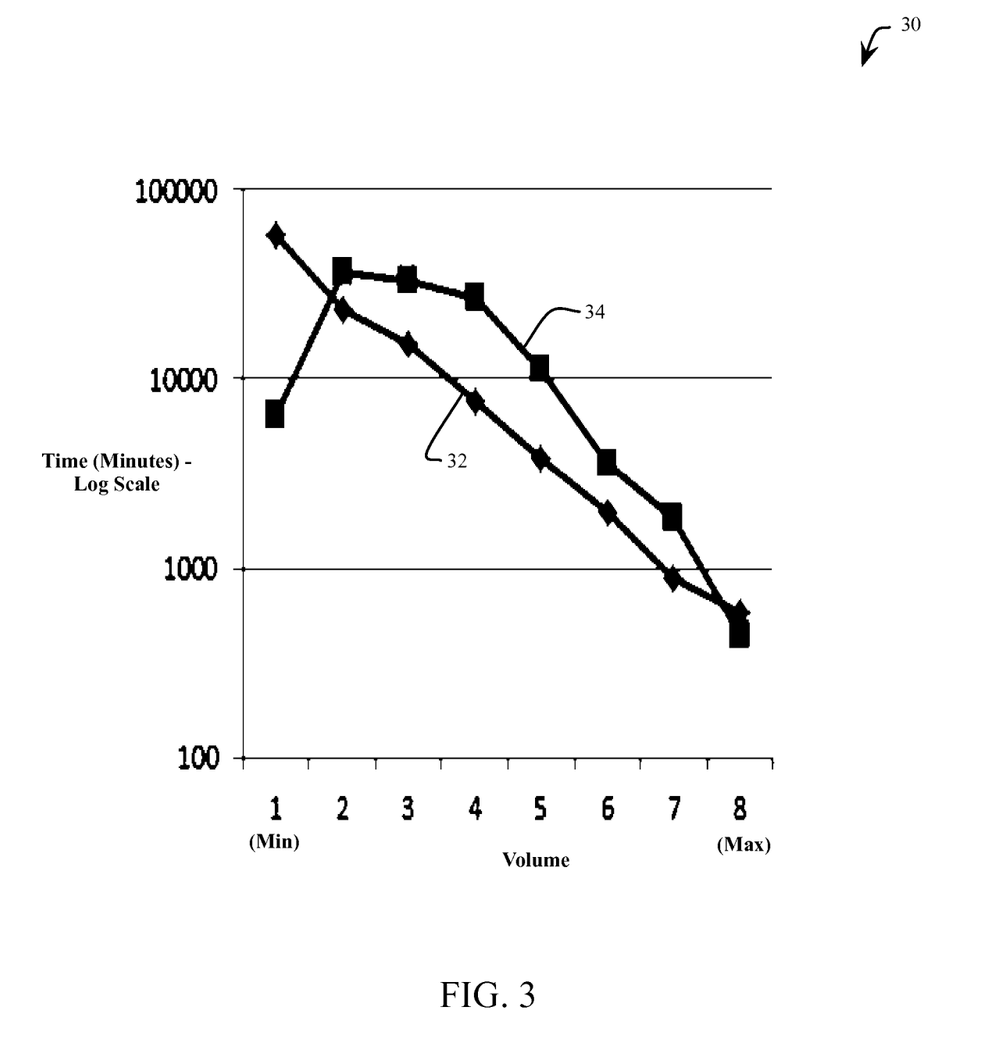
FIG. 3 is graphical view showing typical operating volumes for an embodiment of an audio amplifier system.

FIG. 2 shows a typical total operating temperature for two audio amplifiers used in an automotive application. The total operating temperature includes the ambient temperature added to the temperature resulting from the thermal dissipation of the amplifier. This shows that the first amplifier 22 and the second amplifier 24 operates most frequently within the temperature ranges 20-40 C and 40-60 C, well below typical components maximum operating temperature. The FIG. 3 shows a typical operating volume for another two audio amplifiers used in an automotive application. This shows that the first amplifier 32 and the second amplifier 34 operate most frequently at lower volume levels.

Figure 4:
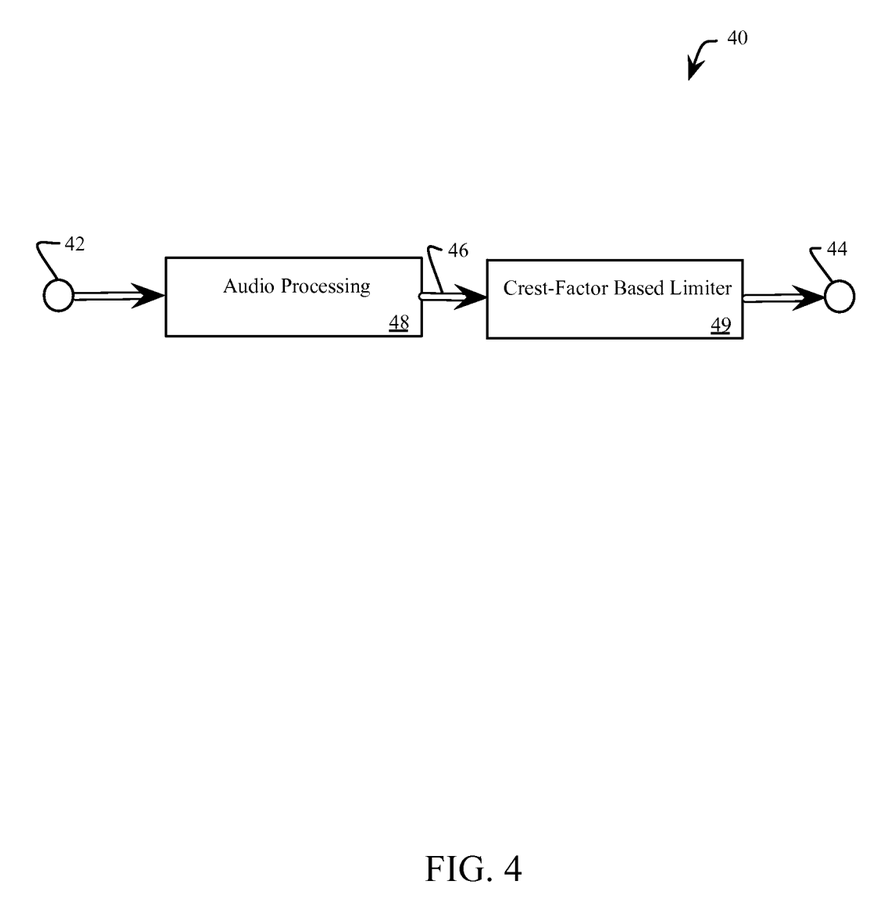
FIG. 4 is a block diagram of an embodiment of an audio amplifier system according to the present invention.

FIG. 4 is a block diagram of an amplifier system 40 with an audio input 42 and an audio output 44. An interim audio output 46 is output from an audio processing block 48, which amplifies the audio input 42. The interim audio output 46 is input to a crest-factor based limiter 49 to produce the audio output 44. In one embodiment, the audio processing block 48 performs a simple limitation by establishing a maximum signal level on each sample of the audio input 42. In a preferred embodiment, the crest-factor based limiter limits the amplification of the audio input 42 based on the energy of the audio input 42 as a proxy for the crest-factor of the audio input 42.

A crest-factor is a ratio of the peak of the signal to a root mean squared (RMS) value of the signal, also referred to as the peak to average ratio (PAR). A peak to average power ratio (PAPR) is the square of the peak divided by the square of the RMS value. Preferably, the gain of the amplifier (e.g. the amplification) is limited for audio inputs 42 that have a low crest factor (e.g. the peak and RMS value are similar) and a high peak (e.g. close to maximum volume). This is equivalent to reducing the amplifier gain for signals that have a high RMS value (e.g. energy) relative to a maximum volume (or digital full-scale). Hence, in a preferred embodiment, the input energy is used as a proxy for crest factor. In other embodiments, the crest factor is used instead of input energy to determine gain limitation. In another embodiment, the PAPR is used instead of input energy to determine gain limitation.

The embodiment 40 shown in FIG. 4 includes a separate audio processing block 48 and a crest-factor based limiter 49. In another embodiment, the audio processing and crest-factor based limiter are combined into the same block. In a preferred embodiment, the audio input 42 is sampled with a sample and hold circuit and quantized samples are used to determine audio input energy for the crest-factor based limiter 49. In another embodiment, the audio input is measured with a linear system without sampling. Continuous time linear circuits (e.g. analog) are used to determine audio input energy for the crest-factor based limiter.

Figure 5:
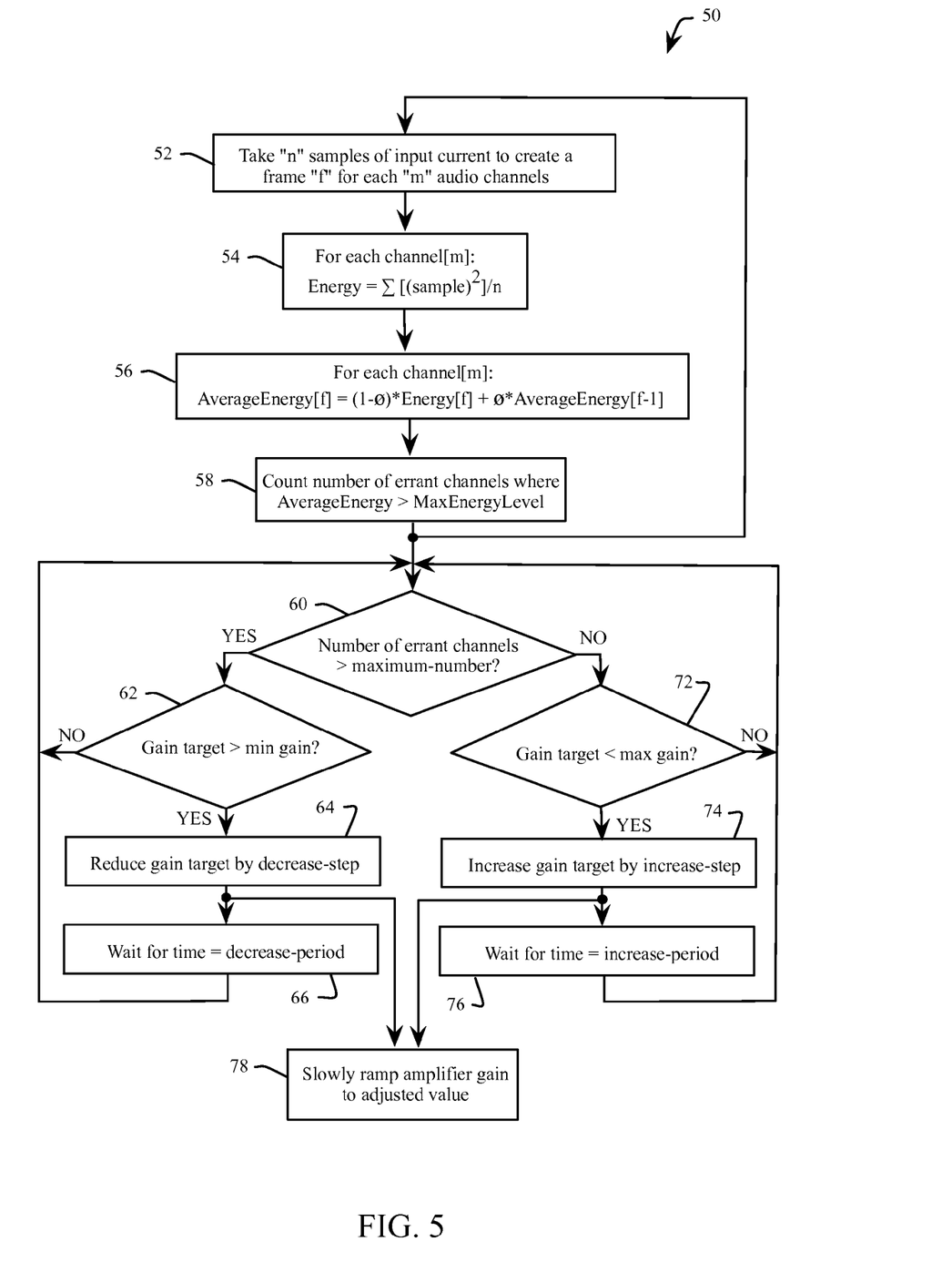
FIG. 5 is a flowchart of a method for crest-factor based gain modification according to an embodiment of the present invention.

The flowchart in FIG. 5 describes a method 50 for a crest-factor based gain modification according to a preferred embodiment. At step 52, "n" samples of the current of the audio input 42 (shown in FIG. 4) are taken for each of "m" audio channels. The "n" samples form a frame "f". In a preferred embodiment, 32 samples (e.g. n=32) are taken to create a "frame." In other embodiments, a different number of samples are taken depending on the rate of change of the audio input 42, desired system response time and accuracy.

At step 54, the energy of the audio input 42 current is determined for each of the channels (e.g. an audio channel having an input and an amplified output). In one embodiment, each sample is multiplied by itself (e.g. determining the squared value of the sample). Each squared value is summed and then divided by the number of samples in the frame.

$$\text{Energy} = \Sigma[(\text{sample})^2]/n$$

At step 56, a running average is determined for each channel according to the following equation:

$$\text{AverageEnergy}[f] = (1-\text{\o})*\text{Energy}[f] + \text{\o}*\text{AverageEnergy}[f-1]$$

The average energy for the current frame ("AverageEnergy [f]") is a percentage ("ø") of the previously determined average energy ("AverageEnergy[f–1]") added to a residual percentage ("1–ø") of the energy ("Energy[f]") for the current frame. In one embodiment, the average energy is updated with every new frame and each frame is determined every 32 samples (e.g. 64 consecutive samples will produce two frames). In another embodiment, a delay occurs between the determination of any two frames, where rate of frame capture depends on the rate of change of the audio input 42, desired system response time and accuracy.

The number of channels (e.g. "errant channels" or "exceeding-audio-inputs") where the average energy of the channel exceeds a maximum energy level (e.g. "MaxEnergyLevel" or "maximum-energy-level") is counted at step 58. The method 50 then returns to step 52 to determine a new frame and also passes the number of errant channels to step 60. At step 60, the number of errant channels is compared to a maximum-number of errant channels to determine if the gain of the audio amplifier should be increased or decreased so that maximum gain is achieved in the amplifier system 40 (see FIG. 4), without exceeding the thermal design limits of the system 40. If the number of errant channels is more than the maximum-number then the method 50 proceeds to step 62, otherwise the method 50 proceeds to step 72.

At step 62, a gain target is compared to a minimum gain (e.g. "min gain"). If the gain target still exceeds the minimum-gain then the gain target is reduced by a "decrease-step" at step 64. Otherwise, the method 50 returns to step 60 after a period of time where a parameter "time" is equal to a "decrease-period" (evaluated at step 66), to reevaluate the number of errant channels based on the new running average (e.g. "AverageEnergy[f]"). In another embodiment, the gain target is reduced if the gain target is greater than or equal to a minimum gain.

At step 72, a gain target is compared to a maximum gain (e.g. "max gain"). If the gain target is still less than the maximum-gain then the gain target is increased by an "increase-step" at step 74. Otherwise, the method 50 returns to step 60 after a period of time where a parameter "time" is equal to an "increase-period" (evaluated at step 76), to reevaluate the number of errant channels based on the new running average (e.g. "AverageEnergy[f]"). In another embodiment, the gain target is reduced if the gain target is less than or equal to a maximum gain.

In a preferred embodiment, following an adjustment to the gain target at either step 64 or step 74, the amplifier gain is slowly ramped to the newly adjusted value at step 78. The slow adjustment in gain reduces low frequency components introduced by step functions and makes for a more pleasing transition in audio gain to maintain maximum gain for improved audio fidelity while operating within the thermal design margins of the amplifier system 40. The amplifier adjustment is applied to the errant channels. In another embodiment, the gain of all channels is adjusted for simplicity. With reference to FIG. 4, a ramper block ramps the gain and is part of the crest-factor based limiter 49. In another embodiment, the ramper block follows the crest-factor based limiter 49.

In a preferred embodiment, the following parameters were chosen for the method 50. The percentage ("ø") is exp[−32/(0.4*44100)]. The maximum energy level ("MaxEnergyLevel") is 4 dB below the maximum level for all channels. The maximum-number is 50% of the number of channels. The decrease-step and the increase-step are each 0.5 dB. The decrease-period is 40 milliseconds. The increase-period is 200 milliseconds. The maximum gain is 0 dB and the minimum gain is −4.0 dB. In a preferred embodiment, the ramper block increases the amplifier gain at a rate of twice the increase-step divided by the increase-period. In a preferred embodiment, the ramper block also decreases the amplifier gain at a rate of twice the decrease-step divided by the decrease-period. This ensures that the amplifier gain is ramped to the adjusted value before a new gain target is determined.

Figure 6:
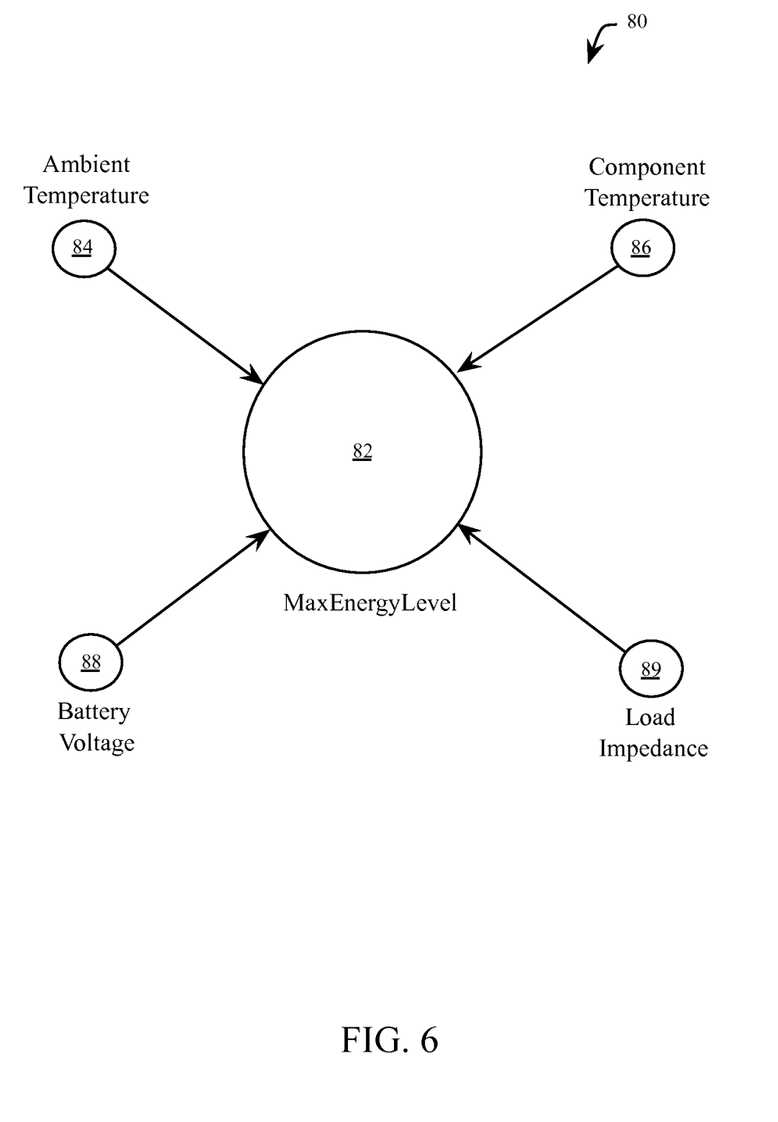
FIG. 6 is a flowchart of the parametric dependencies of the MaxEnergyLevel parameter according to one embodiment of the present invention.

FIG. 6 describes the dependencies 80 of the maximum energy level 82 (e.g. MaxEnergyLevel) on at least four parameters. The MaxEnergyLevel 82 depends on the ambient temperature 84, the component temperature 86, the battery or power supply voltage 88 and the speaker load impedance 89. The ambient temperature 84 is the temperature of the environment where the amplifier is operated. The component temperature 86 is the average temperature of the amplifier 10 in one embodiment. In another embodiment, the component temperature 86 is the temperature of one or more specific components or devices 18 on the amplifier 10. In one example, the temperature of component 18a is measured by a thermocouple.

Figure 7A:
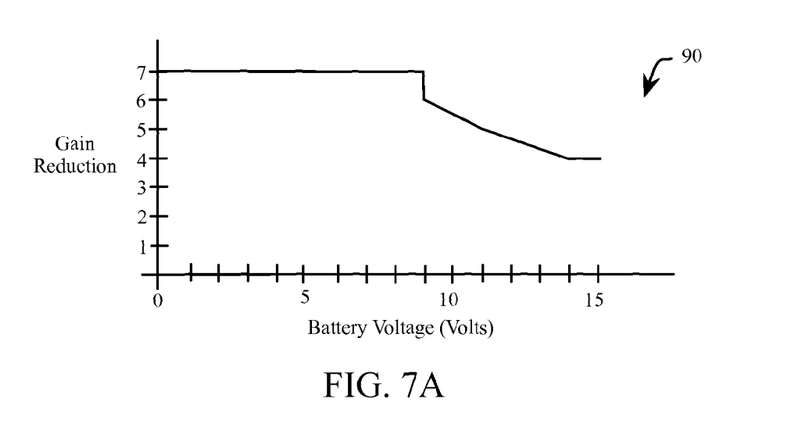
FIG. 7A is a graphical view of gain reduction with respect to battery voltage.

As the battery voltage 88 drops, a switching amplifier will draw higher current to amplify the same audio input level, thus the crest-factor threshold used for a nominal battery voltage needs to be adjusted and hence the MaxEnergyLevel needs to be adjusted. For linear amplifiers, the MaxEnergyLevel has less dependence on battery voltage. With reference to FIG. 7A, in a preferred embodiment 90, the MaxEnergyLevel is adjusted as follows. For a battery voltage equal to or greater than 14V, the MaxEnergyLevel is 4 dB. If the battery voltage is equal to or greater than 11V and less than 14V, the MaxEnergyLevel is 5 dB. If the battery voltage is equal to or greater than 9V and less than 11V the MaxEnergyLevel is 6 dB. If the battery voltage is less than 9V, the MaxEnergyLevel is 7 dB. Similarly, variations in the load impedance 89 also change the amplifier current, which is preferably compensated for by adjusting the MaxEnergyLevel.

Figure 7B:
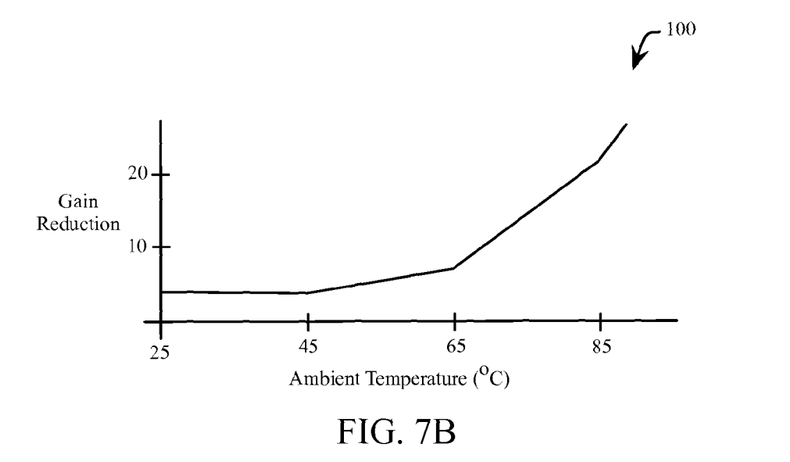
FIG. 7B is a graphical view of gain reduction with respect to ambient temperature.

With reference to FIG. 7B, as the ambient temperature 84 increases, the risk of faster than expected temperature rise on critical components increases since those components will have a starting temperature closer to their maximum operating temperature. It is important to note that most designs are not intended to be functional at full output capability at the maximum allowable operating ambient temperature. These two factors explain why the slope of the gain reduction continues to increase as the ambient temperature get closer to the maximum operating temperature requirement of the amplifier. In one example, for an ambient temperature up to 45 C, the MaxEnergyLevel is 4 dB. If the ambient temperature is between 45 C and 65 C the MaxEnergyLevel linearly increases to 7 dB at 65 C. If the ambient temperature is between 65 C and 85 C the MaxEnergyLevel linearly increases to 20 dB at 85 C. If the ambient temperature has exceeded the products maximum design temperature of 85 C the MaxEnergyLevel increases until the product eventually would shut off to thermal protect itself. The component temperature 86 would follow a similar trend to the ambient temperature 84 with different temperature points and MaxEnergyLevel's depending on the specific amplifier and component.

Figure 7C:
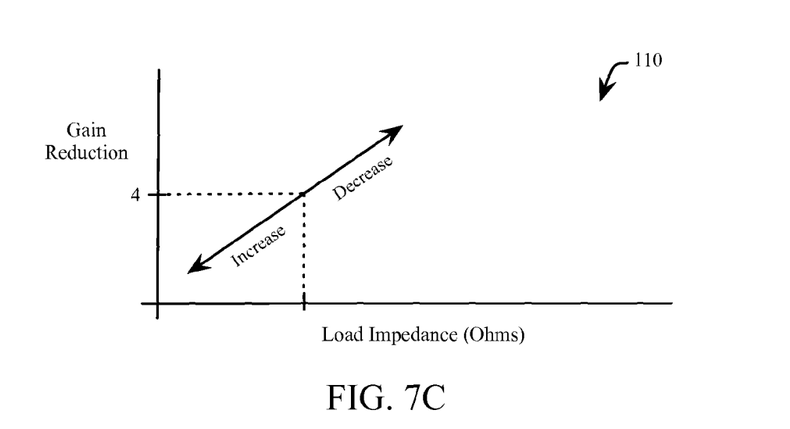
FIG. 7C is a graphical view of gain reduction with respect to load impedance.

With reference to FIG. 7C, as the Load Impedance (89) is change for an existing amplifier design, that specific product variation could have a different MaxEnergyLevel's. If the Load Impedance is lowered because lower resistance speakers are being powered, the MaxEnergyLevel would go up. Conversely, if the Load Impedance is raised because higher resistance speakers are being powered, the MaxEnergyLevel would go down.

Figure 8A:
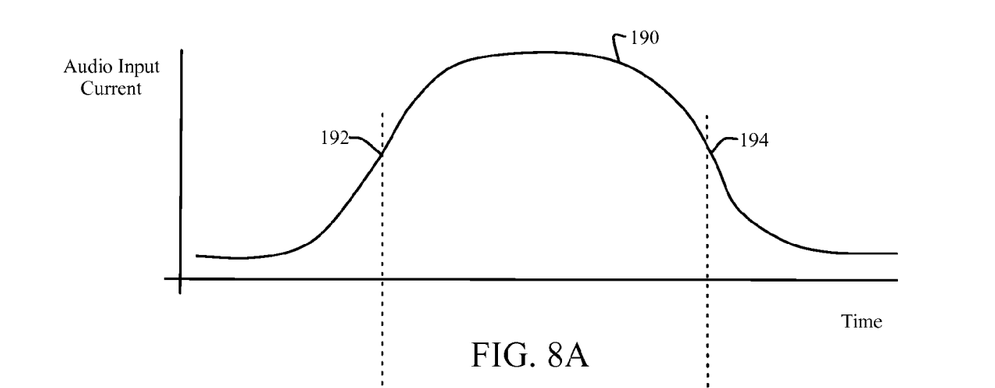
FIG. 8A is a graphical view of audio input current with respect to time.
Figure 8B:
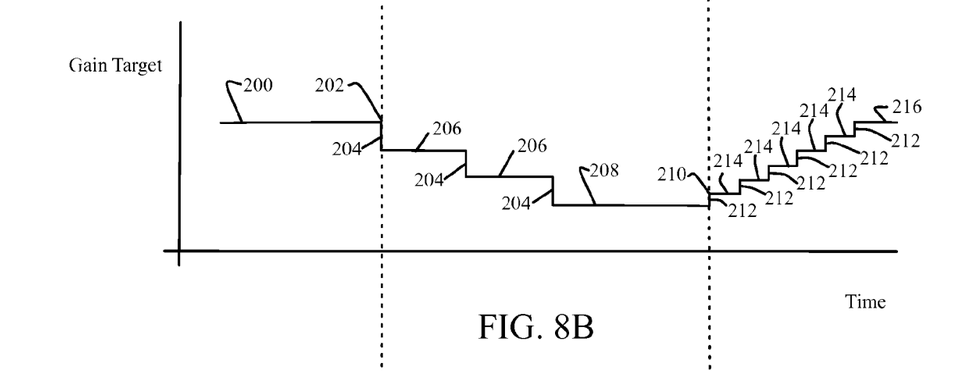
FIG. 8B is a graphical view of the gain target with respect to time.
Figure 8C:
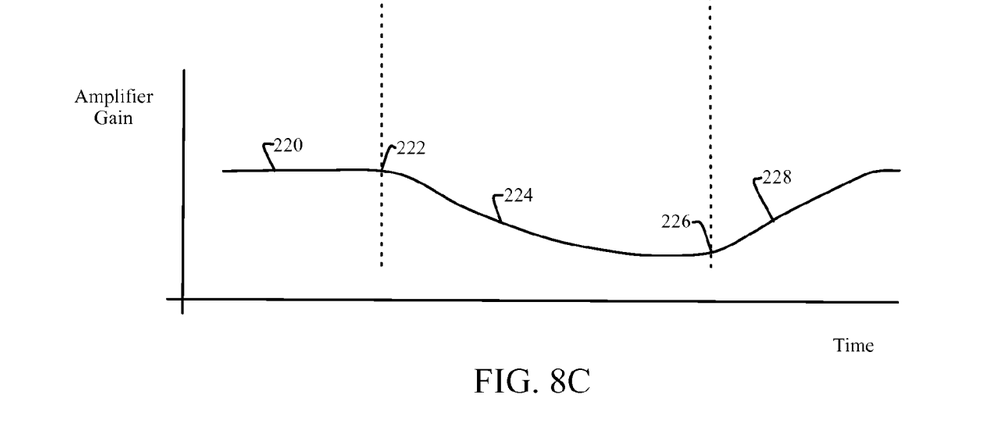
FIG. 8C is a graphical view of amplifier gain with respect to time.

FIG. 8A, FIG. 8B and FIG. 8C show waveforms for audio input current 190, gain target 200 and amplifier gain 220 using the method 50 shown in FIG. 5 in accordance to an embodiment of the crest-factor based gain modification method and system. In FIG. 8A the average energy of the input current 190 of one errant channel exceeds the MaxEnergyLevel at time 192 and subsequently falls below the MaxEnergyLevel at time 194. In FIG. 8B, when a number of errant channels, (one of which is shown in FIG. 8A), exceeds the maximum-number of allowable errant channels, the gain target 200 is reduced at time 202 (corresponding to time 192 in FIG. 8A) by a decrease-step 204 and for a decrease-period 206. Subsequent adjustments to the gain target 200 are applied until the number of errant channels exceeds the maximum-number or until the minimum gain target 208 is reached. At time 210 (corresponding to time 194 in FIG. 8A), the number of errant channels is less than or equal to the maximum-number and the gain target 200 is increased by an increase-step 212 for an increase-period 214. The increase in gain target 200 continues until the maximum gain target 216 is reached or the number of errant channels is no longer greater than the maximum number.

The adjustments to the gain target are applied in a smooth fashion with a ramper block to change the amplifier gain 220 shown in FIG. 8C. At time 222 (corresponding to time 202 in FIG. 8B), the amplifier gain is smoothly reduced at a rate 224. At time 226 (corresponding 210 in FIG. 8B), the amplifier gain is smoothly increased at a rate 228. Accordingly, the thermal energy consumption is efficiently managed by adaptively adjusting the gain of the audio amplifier 40 resulting in improved system efficiency including the use of smaller and lighter heat-sinks to dissipate the thermal energy.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire-line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A number of implementations have been described. Nevertheless, it will be understood that additional modifications may be made without departing from the scope of the inventive concepts described herein, and, accordingly, other embodiments are within the scope of the following claims.

What is claimed is:

1. A method for crest-factor based gain modification comprising:
    sampling at least one audio input to create a frame for each of the at least one audio inputs, each audio input amplified by a respective amplifier to produce an output channel and each frame having at least one sample of the respective at least one audio input;
    determining an energy for each frame of the respective audio inputs;
    determining an average energy for each frame by adding a percentage of a last average energy to a residual percentage of the energy, the last average energy being equal to zero for a first sampling of the at least one audio input and the residual percentage being equal to one hundred minus the percentage of the last average energy;
    determining a number of exceeding audio inputs as a number of the frames that have an average energy exceeding a maximum energy;
    when the number of exceeding audio inputs exceeds a predefined maximum number and a gain target exceeds a predetermined minimum gain, iteratively reducing a gain of the respective amplifier for at least one audio input by a decrease-step for a duration being equal to a decrease-period until the number of exceeding audio inputs is less than or equal to the predefined maximum number or the gain target does not exceed the predetermined minimum gain; and
    when the number of exceeding audio inputs does not exceed the predefined maximum number and the gain target is less than a predetermined maximum gain, iteratively increasing the gain of the respective amplifier for at least one audio input by an increase-step for the duration until the number of exceeding audio inputs exceeds the predefined maximum number or the gain target is not less than the predetermined maximum gain.

2. The method of claim 1 wherein the maximum energy is determined by a value of an ambient temperature.

3. The method of claim 1 wherein the maximum energy is determined by a temperature of a component in each amplifier.

4. The method of claim 1 wherein the maximum energy is determined by a load impedance of at least one speaker in electrical communication with a respective output channel.

5. The method of claim 1 wherein the maximum energy is determined by a battery voltage of a battery used to power each amplifier.

6. The method of claim 1 further comprising ramping the gain of the respective amplifier in response to one of an iterative increase in the gain and an iterative decrease in the gain.

7. The method of claim 1 wherein at least one audio input includes all of the audio inputs.

8. The method of claim 1 wherein the frame includes thirty two samples for each of the at least one audio input.

9. The method of claim 1 wherein determining the average energy for each frame includes calculating the average of a squared value for each sample in the respective frame.

10. The method of claim 1 wherein sampling at least one audio input includes sampling an input current of the respective audio input.

11. The method of claim 1 wherein sampling at least one audio input includes sampling an input voltage of the respective audio input.

12. A method for crest-factor based gain modification comprising:

determining an energy for at least one audio input, each audio input amplified by a respective amplifier to produce an output channel;

determining an average energy for the at least one audio input by adding a percentage of a last average energy to a residual percentage of the energy, the last average energy being equal to zero for a first sampling of the at least one audio input and the residual percentage being equal to one hundred minus the percentage of the last average energy;

determining a number of exceeding audio inputs as a number of audio inputs in the at least one audio input that have an average energy exceeding a maximum energy;

when the number of exceeding audio inputs exceeds a predefined maximum number and a gain target exceeds a predetermined minimum gain, iteratively reducing a gain of the respective amplifier for at least one audio input by a decrease-step for a duration being equal to a decrease-period until the number of exceeding audio inputs is less than or equal to the predefined maximum number or the gain target does not exceed the predetermined minimum gain; and when the number of exceeding audio inputs does not exceed the predefined maximum number and the gain target is less than a predetermined maximum gain, iteratively increasing the gain of the respective amplifier for at least one audio input by an increase-step for the duration until the number of exceeding audio inputs exceeds the predefined maximum number or the gain target is not less than the predetermined maximum gain.

13. The method of claim 12 wherein the maximum energy is determined by a load impedance of at least one speaker in electrical communication with a respective output channel.

14. The method of claim 12 wherein the maximum energy is determined by a value of an ambient temperature.

15. The method of claim 12 wherein the maximum energy is determined by a temperature of a component in each amplifier.

16. The method of claim 12 further comprising ramping the gain of the respective amplifier in response to one of an iterative increase in the gain and an iterative decrease in the gain.

17. A computer program product for crest-factor based gain modification comprising:

a non-transitory computer readable storage medium having computer readable program code embodied therewith, the computer readable program code comprising:

computer readable program code configured to determined an average energy for at least one audio input, by adding a percentage of a last average energy of the audio input to a residual percentage of the energy for the audio input, the last average energy being equal to zero for a first sampling of the audio input and the residual percentage being equal to one hundred minus the percentage of the last average energy of the audio input, wherein each audio input is amplified by an amplifier to produce an output channel;

computer readable program code configured to determine a number of exceeding audio inputs as a number of audio inputs for which the average energy exceeds a maximum energy;

computer readable program code configured to, when the number of exceeding audio inputs exceeds a predefined maximum number and a gain target exceeds a predetermined minimum gain, iteratively reducing a gain of the respective amplifier for the at least one audio input by a decrease-step for a duration being equal to a decrease-period until the number of exceeding audio inputs is less than or equal to the predefined maximum number or the gain target does not exceed the predetermined minimum gain; and computer readable program code configured to, when the number of exceeding audio inputs does not exceed the predefined maximum number and the gain target is less than a predetermined maximum gain, iteratively increasing the gain of the respective amplifier for the at least one audio input by an increase-step for the duration until the number of exceeding audio inputs exceeds the predefined maximum number or the gain target is not less than the predetermined maximum gain.

* * * * *